(12) United States Patent
Sherbin et al.

(10) Patent No.: US 11,482,442 B2
(45) Date of Patent: Oct. 25, 2022

(54) SUBRING FOR SEMICONDUCTOR DIES

(71) Applicant: Texas Instruments Incorporated, Dallas, TX (US)

(72) Inventors: Matthew John Sherbin, Dallas, TX (US); Michael Todd Wyant, Dallas, TX (US); Dave Charles Stepniak, Allen, TX (US); Sada Hiroyuki, Oita-Prefectur (JP); Shoichi Iriguchi, Oita-Prefectur (JP); Genki Yano, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 54 days.

(21) Appl. No.: 17/184,553

(22) Filed: Feb. 24, 2021

(65) Prior Publication Data

US 2021/0183683 A1   Jun. 17, 2021

Related U.S. Application Data

(63) Continuation of application No. 16/118,115, filed on Aug. 30, 2018, now abandoned.

(51) Int. Cl.
*H01L 21/683* (2006.01)
*H01L 21/687* (2006.01)

(52) U.S. Cl.
CPC .... *H01L 21/6836* (2013.01); *H01L 21/68742* (2013.01); *H01L 21/68778* (2013.01); *H01L 2221/68336* (2013.01)

(58) Field of Classification Search
CPC .................. H01L 21/6877; H01L 2221/68336
See application file for complete search history.

(56) References Cited

U.S. PATENT DOCUMENTS

| | | | |
|---|---|---|---|
| 6,830,990 B1 | 12/2004 | Honer et al. | |
| 8,991,329 B1 | 3/2015 | Park et al. | |
| 9,136,173 B2 | 9/2015 | Grivna | |
| 10,867,857 B2 * | 12/2020 | Jeon | H01L 21/3065 |
| 2010/0226745 A1 | 9/2010 | Umehara et al. | |
| 2014/0127885 A1 | 5/2014 | Grivna | |
| 2018/0141163 A1 | 5/2018 | Wendt et al. | |
| 2018/0142130 A1* | 5/2018 | Hayash | C09J 133/12 |
| 2020/0027772 A1 | 1/2020 | Sherbin et al. | |

* cited by examiner

*Primary Examiner* — Mounir S Amer
(74) *Attorney, Agent, or Firm* — Ronald O. Neerings; Charles A. Brill; Frank D. Cimino

(57) ABSTRACT

A subring for holding tape connected to semiconductor dies and spanning a passage in a frame having a first diameter includes a base. An opening extends through the base and has a second diameter at least as large as the first diameter. A projection extends from the base to ends positioned on opposite sides of the base. The projection is adapted to clamp the tape to the frame and adapted to prevent relative movement between the tape, the subring, and the frame.

15 Claims, 10 Drawing Sheets

SUBRING FOR SEMICONDUCTOR DIES

This application is a continuation of U.S. patent application Ser. No. 16/118,115, filed Sep. 30, 2018, the contents of all of which are herein incorporated by reference in its entirety.

TECHNICAL FIELD

The present disclosure relates generally to semiconductors and, more specifically, relates to a subring for clamping and expanding tape holding a partitioned semiconductor wafer.

SUMMARY

In one example, a subring for holding tape connected to semiconductor dies and spanning a passage in a frame having a first diameter includes a base centered on and extending about an axis. An opening extends through the base and has a second diameter at least as large as the first diameter. A projection extends from the base to ends positioned on opposite sides of the base. The projection is adapted to clamp the tape to the frame and adapted to prevent relative movement between the tape, the subring, and the frame.

In another example, a system for holding tape connected to semiconductor dies includes a frame having opposing first and second surfaces and a passage extending from the first surface to the second surface. The passage has a first diameter and the tape is attached to the second surface to align the dies with the passage. A subring formed from sections includes a base. An opening extends through the base and has a second diameter at least as large as the first diameter. A projection extends from the base to ends positioned on opposite sides of the base. The projection is adapted to clamp the tape in an expanded condition to the frame and adapted to prevent relative movement between the tape, the subring, and the frame. A cap is positioned over the projection for holding the sections together and adapted to clamp the tape between the cap and the projection.

In another example, a method for holding tape connected to semiconductor dies includes securing the tape to a first surface of a frame having a passage with a first diameter such that the dies are aligned with the passage. Sections of a subring are inserted through the passage to expand the tape and move the dies through the passage to a position axially spaced from a second surface of the frame opposing the first surface. The sections are assembled into the subring such that the expanded tape is clamped between the subring and the frame. The assembled subring has an opening with a second diameter at least as large as the first diameter of the passage. A chuck is passed through the opening and the passage to further expand the tape and space the dies a predetermined distance from one another. One of the dies is picked from the expanded tape and electrically connected to leads.

Other objects and advantages and a fuller understanding of the invention will be had from the following detailed description and the accompanying drawings.

DETAILED DESCRIPTION

Figure 1A:
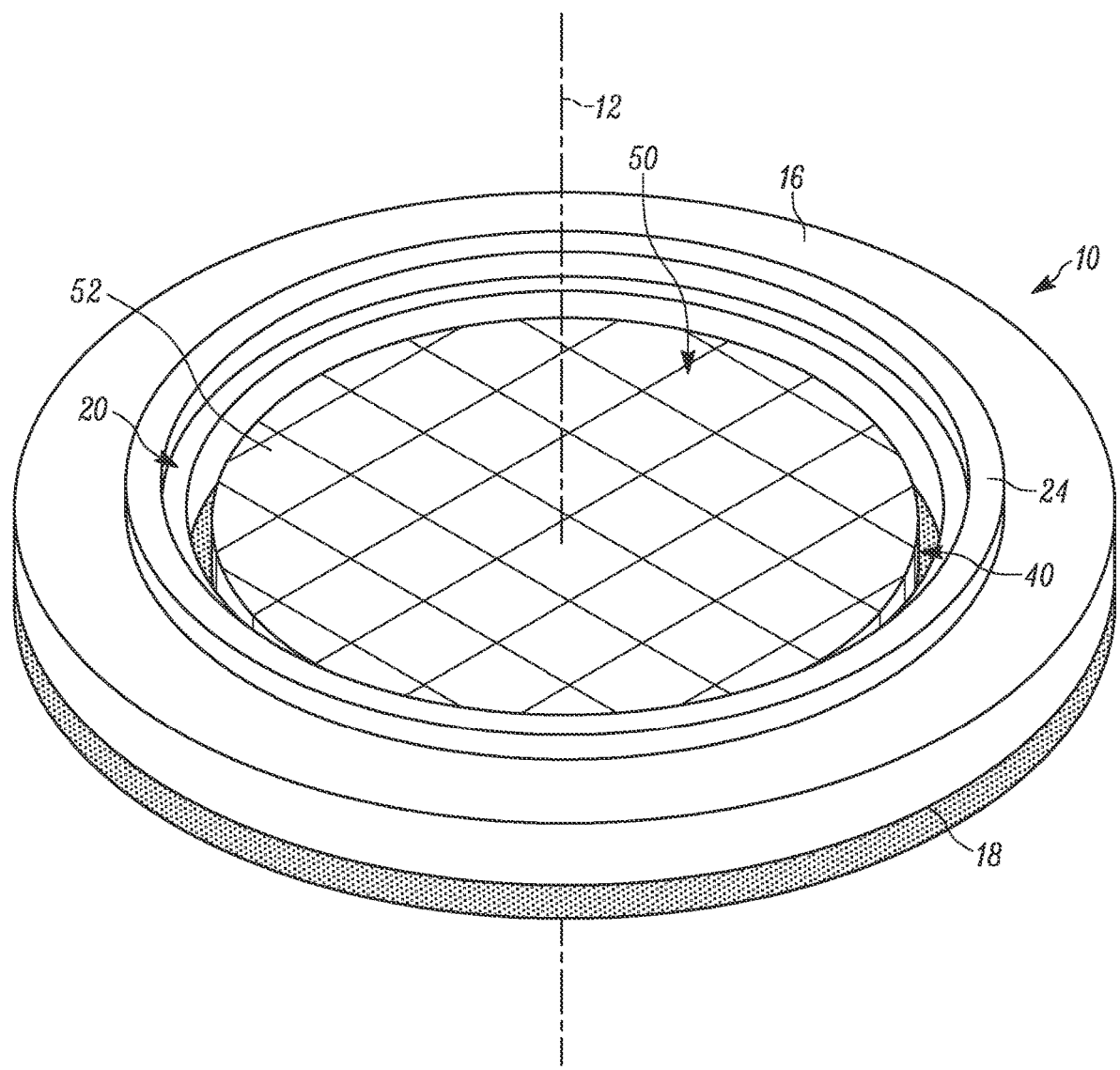
FIG. 1A is a schematic illustration of an example semiconductor wafer and a frame.
Figure 1B:
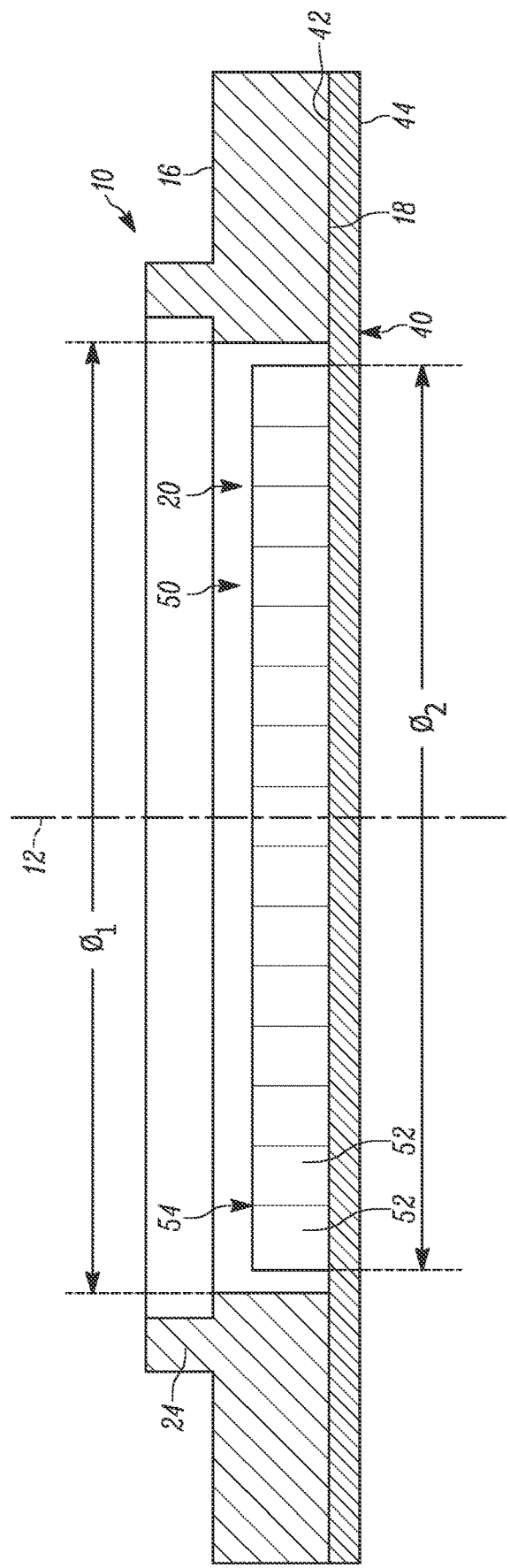
FIG. 1B is a section view of the frame taken along line 1B-1B of FIG. 1A.

The present disclosure relates generally to semiconductors and, more specifically, relates to a subring for clamping and expanding tape holding a partitioned semiconductor wafer. FIGS. 1A-1B illustrate an example frame 10. The frame 10 can be made from a durable material such as a metal (aluminum, steel, stainless steel, etc.) or a polymer. The frame 10 is ring-shaped and extends along and about an axis 12. The frame 10 includes opposing first and second surfaces 16, 18 that can extend parallel to one another. A passage 20 extends along the axis 12 from the first surface 16 to the second surface 18. The passage 20 has a first diameter $\Phi_1$, which can be about 350 mm. A projection 24 extends from the first surface 16 and encircles the axis 12. The projection 24 is radially spaced from the passage 20 and can have a rectangular cross-section. The projection 24 can be omitted.

Tape 40 is secured to the second surface 18 of the frame 10. The tape 40 has the same footprint as the frame 10 and therefore spans and covers the passage 20. The tape 40 is made from, for example, a polyvinyl chloride, polyolefin or polyethylene backing material with an adhesive to secure the tape to the frame 10. The adhesive bond can be broken with ultraviolet light or can be a pressure adhesive. The tape 40 can have a thickness of, for example, about 75 to 160 μm. The tape 40 is configured to be flexible and elongate without tearing. A surface 42 of the tape 40 has a periphery 44 abutting and securely connected to the second surface 18 of the frame 10. The remainder of the surface 42 is exposed through the passage 20.

A wafer 50 is adhered to the surface 42 of the tape 40 and positioned within the passage 20 of the frame 10. The wafer 50 is therefore axially aligned with the passage 20. The wafer 50 can be circular and has a second diameter $\Phi_2$ smaller than the first diameter $\Phi_1$ of the passage 20. The second diameter $\Phi_2$ can be about 200-300 mm. The wafer 50 is formed from one or more semiconductor materials used in making electronic components, such as part of an integrated circuit. The wafer 50 is provided on the tape 40 after undergoing a wafer dicing process, e.g., scribing, mechanical sawing or laser cutting such as Mahoh dicing.

That said, the wafer 50 shown in FIGS. 1A-1B is already partitioned or divided into dies 52 separated by gaps 54 due to kerf loss. The kerf loss in most dicing techniques approaches 0 μm and, thus, the dies 52 are positioned generally close to one another. Each die 52 can have a footprint of about 500×500 μm or smaller.

Figure 2A:
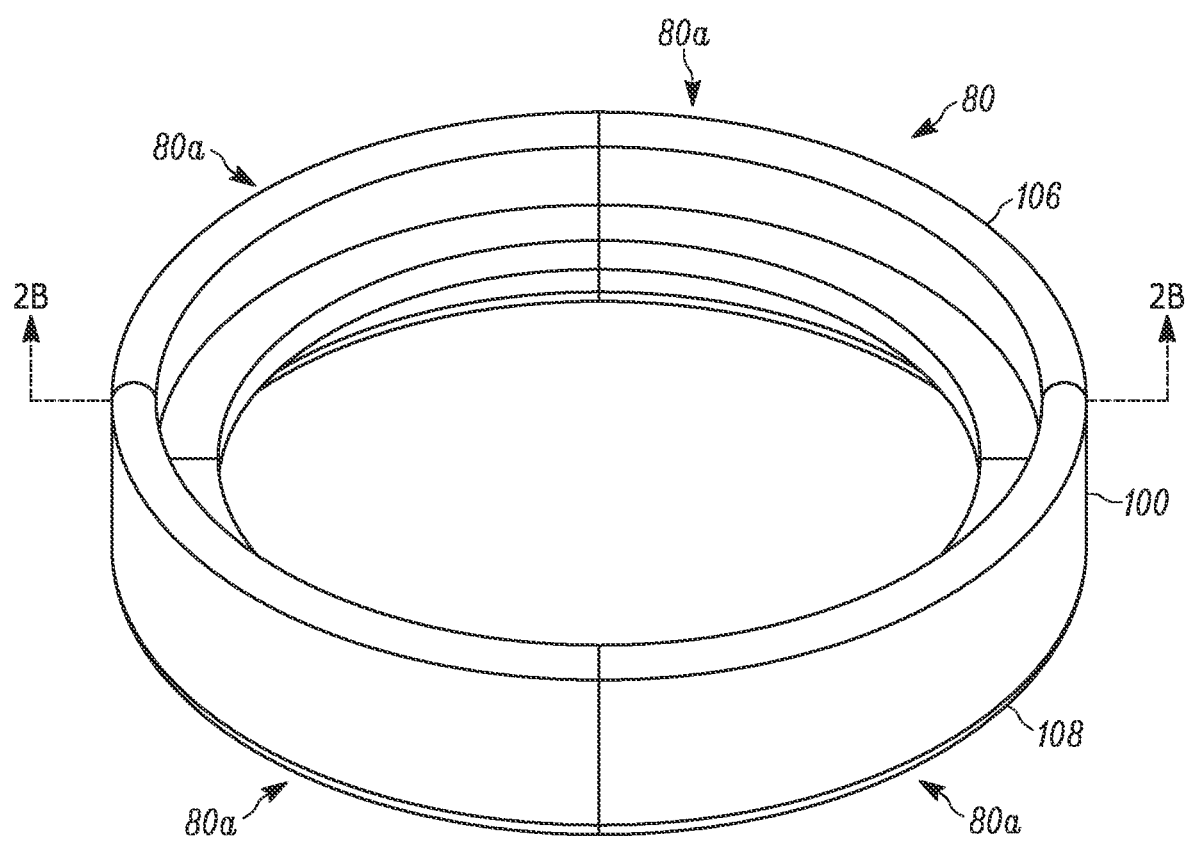
FIG. 2A is a front view of an example subring for use with the frame of FIG. 1A.
Figure 2B:
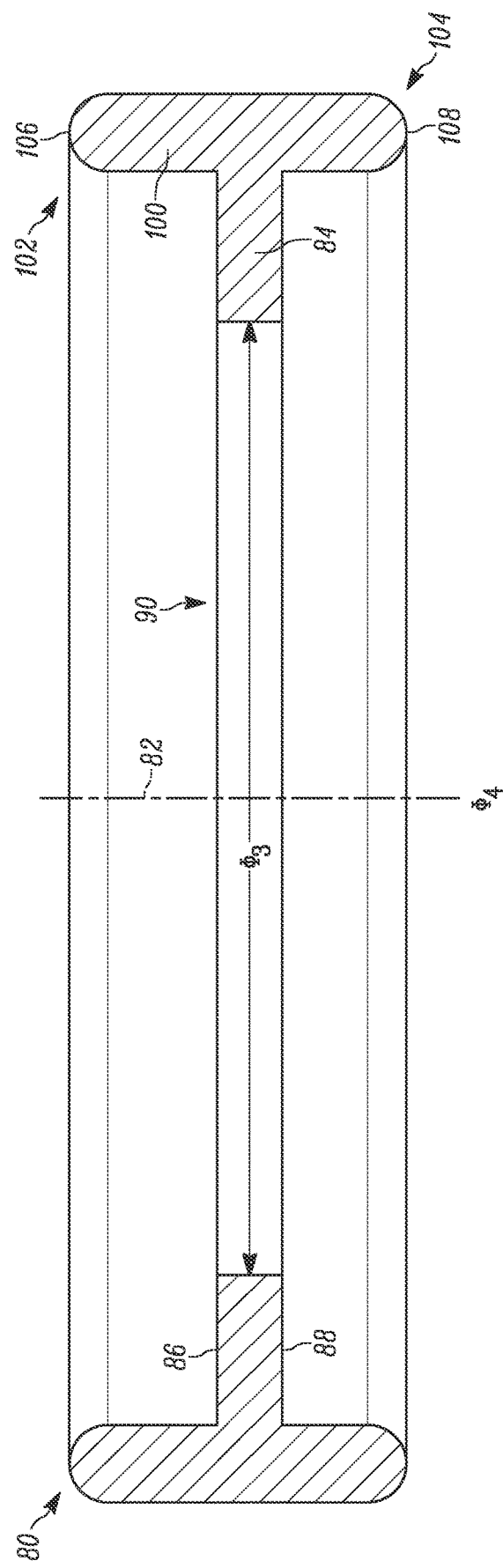
FIG. 2B is a section view of the subring taken along line 2B-2B of FIG. 2A.

Referring to FIGS. 2A-2B, a subring 80 is used to increase the gaps 54 between the dies 52. The subring 80 is ring-shaped and extends along and about an axis 82. The subring 80 is formed from multiple, discrete sections 80*a* assembled end-to-end in a circumferential manner. As shown, the subring 80 includes four sections 80*a* having equal circumferential lengths. Alternatively, the subring 80 could be formed from more or fewer sections 80*a* having the same or different circumferential lengths. In any case, the circumferential cross-section of each section 80*a* is identical. The subring 80 can be formed from metal.

The subring 80 includes a planar base 84 having opposing first and second surfaces 86, 88. The surfaces 86, 88 can extend parallel to one another. An opening 90 extends along the axis 82 from the first surface 86 to the second surface 88. The opening 90 has a third diameter $\Phi_3$ at least as large as the first diameter $\Phi_1$ of the passage 20 in the frame 10, e.g., at least 350 mm.

A projection 100 extends transversely from the base 84. In one example, the projection 100 extends perpendicular to the base 84. The projection has a first end 102 and a second end 104 located on opposite sides of the base 84. The first end 102 terminates at a curved or rounded surface 106. The second end 104 terminates at a curved or rounded surface 108. The surfaces 106, 108 can have any rounded shape, e.g., arcuate, hemispherical, oval parabolic, etc.

Figure 3:
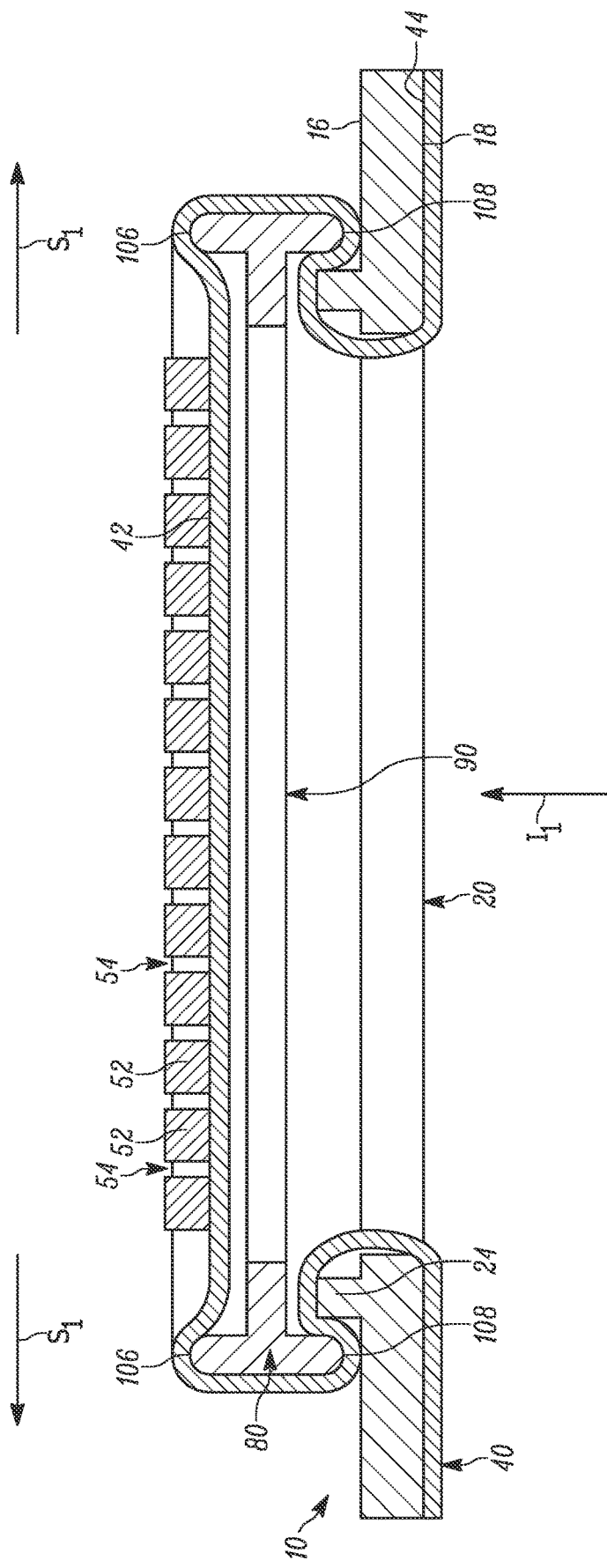
FIG. 3 is a side section view of the frame of FIG. 1A with the subring of FIG. 2A installed thereon.
Figure 4:
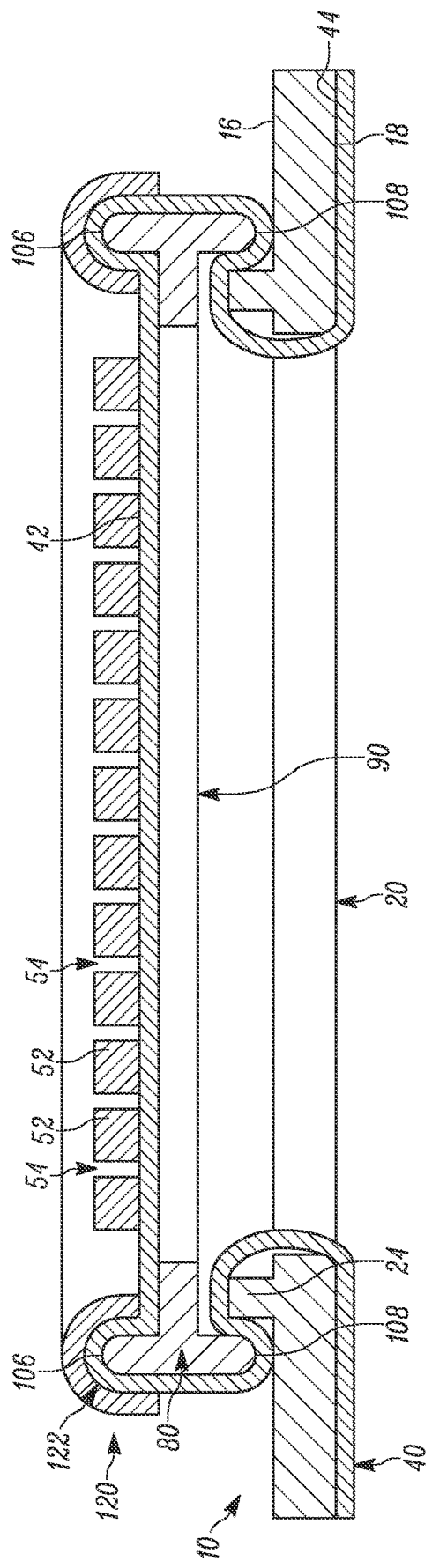
FIG. 4 is a side section view of the assembly of FIG. 3 with a cap installed on the subring.

As shown in FIG. 3, the subring 80 is provided on the frame 10 to expand and hold the tape 40 to increase the gaps 54 between dies 52. More specifically, the sections 80*a* of the subring 80 are individually pressed into engagement with the tape 40 and urged through the bottom (as shown) of the passage 20 in the direction $I_1$. Since the periphery 44 of the tape 40 is secured to the frame 10, the remainder of the tape spanning the passage 20 elongates or expands to allow the sections 80*a* to move through the passage. The sections 80*a* are moved separately in the direction $I_1$ because the assembled subring 80 is too large to pass through the passage 20. The flexible nature of the tape 40 allows it to expand/elongate in the directions $S_1$ through the passage 20 and continue supporting the wafer 50 while the periphery 44 remains fixed to the second surface 18 of the frame 10.

The sections 80*a* are moved in the direction $I_1$ until the wafer 50 is passes entirely through the passage 20 and is axially spaced from the first surface 16 of the frame 10. The sections 80*a* are then aligned end-to-end within the expanded tape 40 to assemble the subring 80 with the surface 106 of the projection 100 engaging the tape. The sections 80*a* can include cooperating projections or alignment features (not shown) to facilitate assembly. In any case, the assembled subring 80 is moved towards the frame 10 until the tape 40 becomes clamped or held between the surface 108 of the projection 100 and the first surface 16 of the frame 10. As a result, both surfaces 106, 108 of the projection 100 engage and support the tape 40.

In this configuration, the tape 40 can also extend radially inward over the projection 24 (when present) on the frame 10. Regardless, the tape 40 passes entirely through the passage 20 to the periphery 44. The projections 24, 100 cooperate to hold the tape 40 in the expanded condition by maintaining tension on the tape 40 and preventing relative movement between the tape and the frame 10/subring 80. It will be appreciated that when the projection 24 on the frame 10 is omitted the projection 100 alone would maintain tension on the tape 40 and prevent relative movement therebetween.

In any case, once the subring 80 is in place and the tape 40 elongated, a cap 120 is positioned over the projection 100 to maintain the sections 80*a* of the subring in position. The cap 120 is a unitary structure having a cross-section complimentary to the surface 106 of the projection 100. To this end, the cap 120 includes an annular recess 122 for receiving the first end 102 of the projection 100. The cap 120 is aligned with the surface 106 and set on the subring 80 to clamp or hold the tape 40 within the recess 122 between the cap and the surface 106. This further helps maintain the tape 40 in the expanded condition. The cap 120 is made from a durable material such as metal.

The curved or rounded shape of the surfaces 106, 108 helps prevent tearing of the tape 40. In particular, the surfaces 106, 108 are configured to provide atraumatic contact between the projection 100 and the tape 40 while adequately preventing relative movement therebetween to maintain tension in the tape.

Figure 5:
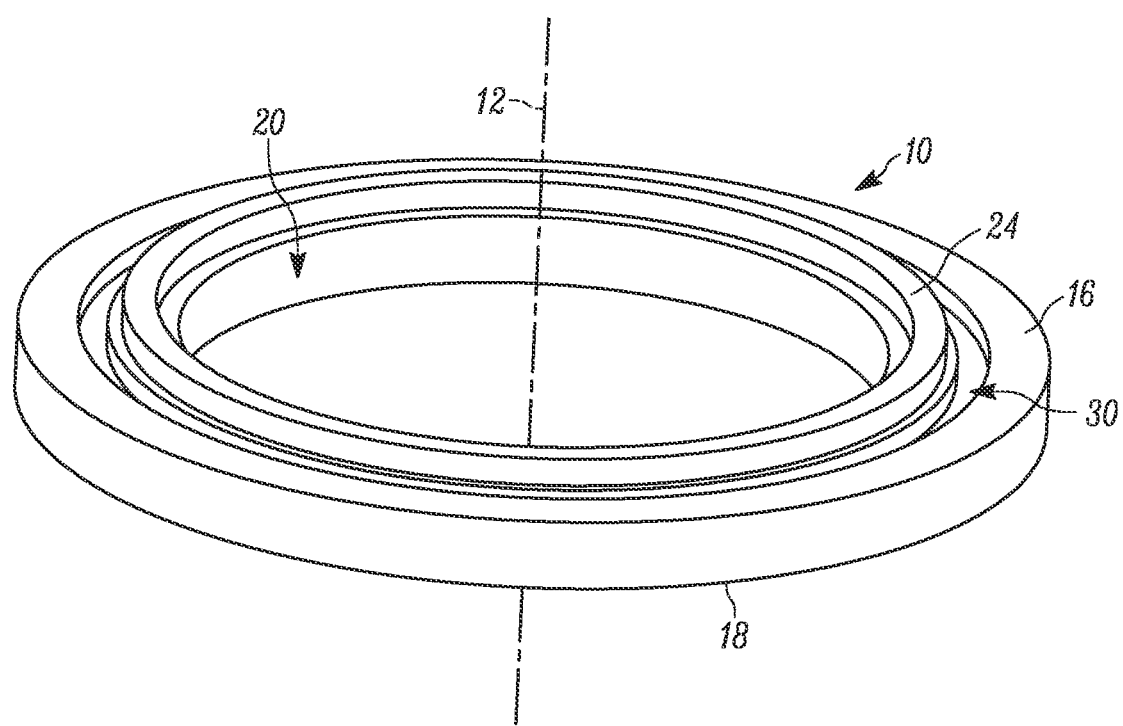
FIG. 5 is a side section view of another example frame.

In an alternative configuration shown in FIG. 5, the frame 10 can further include an annular recess 30. The recess 30 is formed in the first surface 16 and extends towards the second surface 18. The recess 30 can have any cross-section, e.g., rectangular or curved/rounded. The recess 30 encircles the axis 12 and is positioned radially outward of the projection 24 (if present). The recess 30 can be formed in the frame 10 by etching or pressing and have rounded/smooth internal edges to minimize adversely affecting the tape 40.

Figure 6:
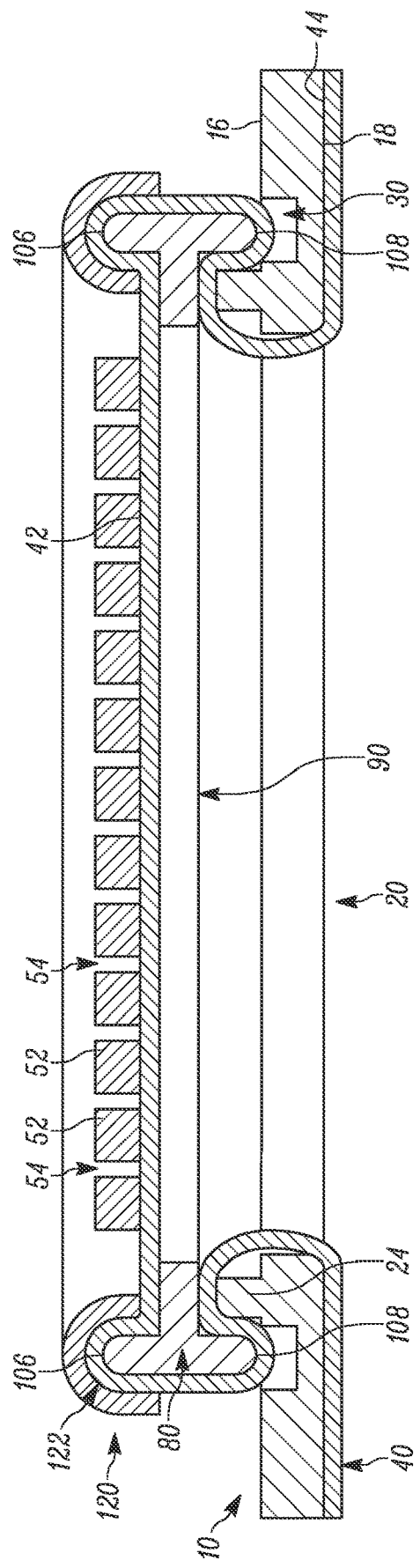
FIG. 6 is a side section view of the frame of FIG. 5 with the subring installed thereon.

When the sections 80*a* are assembled into the subring 80 (see FIG. 6), the projection 100 is received in the recess 30 to clamp or hold the tape 40 between the surface 108 of the projection and the frame 10. Not only does this provide additional holding forces on the tape 40 to prevent movement thereof but the assembled subring 80 is prevented from sliding along or relative to the frame 10, i.e., the subring is fixed in place on the frame. Consequently, the recess 30 and cap 120 cooperate to maintain the sections 80*a* together as the assembled subring 80.

Figure 7:
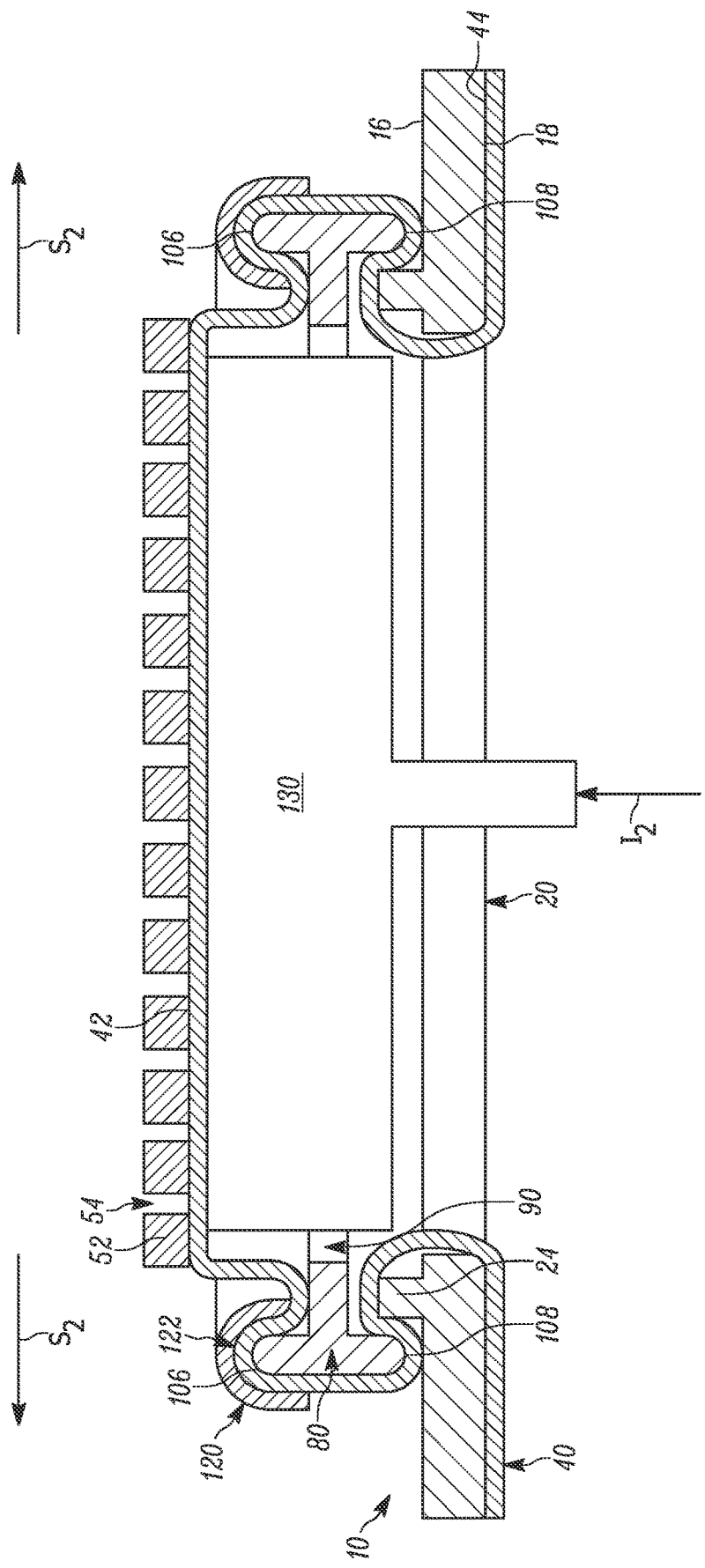
FIG. 7 is a side section view of the assembly of FIG. 4 following expansion of the wafer.

In either construction of the frame 10, once the cap 120 is in place, a chuck 130 is used to further expand the tape 40 (see FIG. 7). The frame 10 is fixed in position and the chuck 130 is aligned with the passage 20 and the opening 90. The chuck 130 is moved in the direction $I_2$ first though the passage 20 in the frame 10 and then the opening 90 in the subring 80. The chuck 130 engages the tape 40. Further movement of the chuck 130 in the direction $I_2$ pushes the tape 40 in the direction $I_2$ relative to the frame 10 and subring 80.

Since the frame 10 and subring 80 are fixed in place and hold the periphery 44 of the tape 40, the tape expands and elongates in the directions $S_2$. The dies 52 are fixed to the tape 40 and, thus, this stretching causes the dies to spread apart from one another in the directions S2, thereby further increasing the gaps 54 therebetween.

In one example, the gaps 54 are configured to allow a die picking device (not shown) to individually pick the dies 52 off the tape 40 without affecting the surrounding dies. In current die picking operations, the die-to-die gap is small enough that there is a risk that picking one die will result in damage to one or more of the surrounding dies. To this end, the tape adhered to the frame and die has a finite ability to elongate. As a result, the expansion process—while increasing the die-to-die gap—can be insufficient for adequately spacing the dies apart from one another.

Moreover, with the semiconductor industry moving towards smaller dies, the problem is exacerbated and space is at a premium. When the die size shrinks, the die-to-die gap following partitioning and expansion shrinks due to the same stretched area of tape being used to accommodate more dies. This can increase the incidence of die-to-die collision and/or chipping.

The subring 80 is advantageous for having an increased diameter to allow for more expansion of the tape 40, thereby increasing the gaps 54 between the dies 52. In current designs, the subring attaches to the inner edge of the frame adjacent the passage. This reduces the effective diameter of the frame as the chuck passing therethrough is sized by the smallest diameter passage it must pass through. In other words, the chuck has to have a smaller diameter in current subring constructions to pass through the smaller passage of the subring and expand the tape. This reduces the extent to which the tape can be expanded.

On the other hand, the subring 80 attaches to the frame 10 a spaced distance from the passage 20 and has a passage diameter $\Phi_3$ at least as large as the passage diameter $\Phi_1$ in the frame. Consequently, the chuck 130 can be sized to approximate the full diameter $\Phi_1$ of the passage 20, which allows the same sized tape to be expanded a greater degree, e.g., up to about 30% greater, than with existing frames. The excess expansion can be distributed amongst the die gaps 54 to thereby increase the average die-to-die gap and help reduce breakage and collision during picking. Along the same lines, using the subring 80 described herein will allow smaller dies to be formed from the wafer 50 using the Mahoh laser saw. The Mahoh saw has a higher yield than mechanical saws and is cheaper to operate. The Mahoh saw also allows for scribe reductions and can reduce the amount of semiconductor material needed to form the smaller dies by reducing waste.

The subring described herein is also advantageous because it can be formed from a more durable material than existing subrings. In current designs, the subring is typically formed from a metal ring with a resin component where the subring engages the tape. This resin, however, can wear over time and reduce the clamping efficacy of the subring. The curved surfaces of the subring, however, can be made from the same material as the rest of the subring and maintain clamping ability without wearing. The curved surfaces also have atraumatic engagement with the tape.

Figure 8:
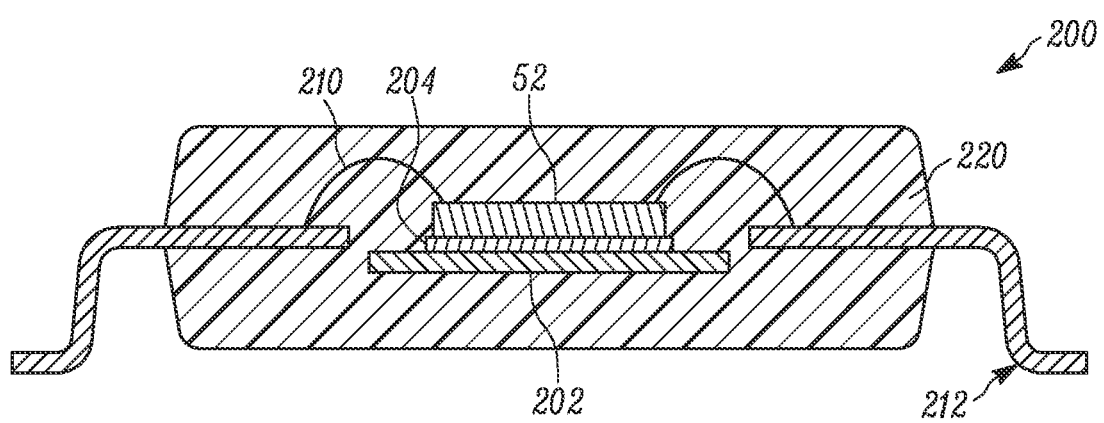
FIG. 8 is a side section view of an integrated circuit package having a die formed for the semiconductor wafer.

FIG. 8 illustrates an example integrated circuit package 200 formed from one of the dies 52. Once the dies 52 are separated from one another using the subring 80 and chuck 130, the die picking device (not shown) removes the separated dies from the stretched tape 40. To form the integrated circuit package 200, one of the dies 52 is secured to a die pad 202 via an adhesive 204 or the like. Bond wires 210 electrically connect the die 52 to outwardly extending leads 212. The components 52, 202, 204, 210, 212 are then encased in an epoxy compound 220 such that the outer ends of the leads 212 are exposed. The integrated circuit package 200 can then be provided on a printed circuit board (not shown) with one or more other integrated circuit packages.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming an integrated circuit, comprising the steps of:
    providing holding tape connected to semiconductor dies;
    securing the tape to a first surface of a frame having a passage with a first diameter such that the dies are aligned with the passage;
    inserting sections of a subring through the passage to expand the tape and move the dies through the passage to a position axially spaced from a second surface of the frame opposing the first surface;
    assembling the sections into the subring such that the expanded tape is clamped between the subring and the frame, the assembled subring having an opening with a second diameter at least as large as the first diameter of the passage;
    passing a chuck through the opening and the passage to further expand the tape and space the dies a predetermined distance from one another;
    picking one of the dies from the expanded tape; and
    electrically connecting leads to the die.

2. The method of claim 1, further comprising inserting a projection on the assembled subring into a recess in the second surface of the frame to clamp the tape between the projection and the frame.

3. The method of claim 1, further comprising positioning a cap over the projection to hold the sections together and clamp the tape between the projection and the cap.

4. The method of claim 1, wherein the ends of the projection are rounded.

5. The method of claim 1, wherein the second diameter is larger than the first diameter.

6. The method of claim 1, further comprising positioning a cap over the assembled subring to hold the sections together and clamp the tape between the cap and subring.

7. The method of claim 1, wherein the cap includes an annular recess for receiving one of the ends of the projection such that the tape is clamped between the cap and the projection.

8. The method of claim 2, wherein the opposite ends of the projection are configured to engage the tape.

9. The method of claim 2, wherein the ends of the projection are formed from metal.

10. The method of claim 1, wherein the semiconductor dies have a footprint less than 500×500 µm.

11. A method of forming an integrated circuit, comprising the steps of:
    providing holding tape connected to semiconductor dies;
    securing the tape to a first surface of a frame having a passage with a first diameter such that the dies are aligned with the passage;
    inserting sections of a subring through the passage to expand the tape and move the dies through the passage to a position axially spaced from a second surface of the frame opposing the first surface; and
    assembling the sections into the subring such that the expanded tape is clamped between the subring and the frame, the assembled subring having an opening with a second diameter at least as large as the first diameter of the passage.

12. The method of claim 11, further comprising passing a chuck through the opening and the passage to further expand the tape and space the dies a predetermined distance from one another;
    picking one of the dies from the expanded tape; and
    electrically connecting leads to the die.

13. The method of claim 11, further comprising inserting a projection on the assembled subring into a recess in the second surface of the frame to clamp the tape between the projection and the frame.

14. The method of claim 11, further comprising positioning a cap over the projection to hold the sections together and clamp the tape between the projection and the cap.

15. The method of claim 11, further comprising positioning a cap over the assembled subring to hold the sections together and clamp the tape between the cap and subring.

\* \* \* \* \*